United States Patent
Ouderkirk et al.

(10) Patent No.: US 7,285,802 B2
(45) Date of Patent: Oct. 23, 2007

(54) ILLUMINATION ASSEMBLY AND METHOD OF MAKING SAME

(75) Inventors: Andrew J. Ouderkirk, Woodbury, MN (US); Hung T. Tran, Woodbury, MN (US); John C. Schultz, Afton, MN (US); John A. Wheatley, Lake Elmo, MN (US); Joseph A. Hoffman, Minneapolis, MN (US); Kay-Uwe Schenke, Hubertusweg (DE); Michael A. Meis, Stillwater, MN (US); Stephen J. Pojar, Marine-on-the-St. Croix, MN (US); Wolfgang N. Lehnhardt, Düsseldorf (DE)

(73) Assignee: 3M Innovative Properties Company, St. Paul, MN (US)

( * ) Notice: Subject to any disclaimer, the term of this patent is extended or adjusted under 35 U.S.C. 154(b) by 34 days.

(21) Appl. No.: 11/018,605

(22) Filed: Dec. 21, 2004

(65) Prior Publication Data

US 2006/0131602 A1    Jun. 22, 2006

(51) Int. Cl.
*H01L 33/00* (2006.01)
(52) U.S. Cl. .......................... 257/98; 257/99; 362/373
(58) Field of Classification Search .......... 257/79–103, 257/13, 676, 705–707, 712, 720; 362/373
See application file for complete search history.

(56) References Cited

U.S. PATENT DOCUMENTS

| | | | |
|---|---|---|---|
| 4,742,432 A | 5/1988 | Thillays et al. |
| 4,774,434 A | 9/1988 | Bennion |
| 5,727,310 A | 3/1998 | Casson et al. |
| 5,857,767 A | 1/1999 | Hochstein |
| 5,882,774 A | 3/1999 | Jonza et al. |
| 5,897,329 A | 4/1999 | Jewell |
| 5,998,935 A | 12/1999 | Marcotte |
| 6,080,467 A | 6/2000 | Weber et al. |
| 6,130,646 A | 10/2000 | Jang |
| 6,164,789 A | 12/2000 | Unger et al. |

(Continued)

FOREIGN PATENT DOCUMENTS

EP          328088 A       8/1989

(Continued)

OTHER PUBLICATIONS

Lumileds Lighting U.S., "LLC, Luxeon® Emitter Assembly Information", application brief AB10, [retrieved from internet Dec. 17, 2004], URL <lumileds.com/pdfs/AB10.pdf>, 2004, 12 pages.

(Continued)

*Primary Examiner*—Thien F Tran
(74) *Attorney, Agent, or Firm*—Jay R. Pralle

(57) ABSTRACT

An illumination assembly including a thermally conductive substrate, a patterned conductive layer proximate a major surface of the thermally conductive substrate, a dielectric layer positioned between the patterned conductive layer and the major surface of the substrate, and at least one LED including a post that is attached to the thermally conductive substrate such that at least a portion of the post is embedded in the thermally conductive substrate is disclosed. The at least one LED can be thermally connected to the thermally conductive substrate through the post and electrically connected to the patterned conductive layer. The dielectric layer can be reflective.

9 Claims, 3 Drawing Sheets

U.S. PATENT DOCUMENTS

| | | |
|---|---|---|
| 6,274,924 B1 | 8/2001 | Carey et al. |
| 6,362,964 B1 | 3/2002 | Dubhashi et al. |
| 6,428,189 B1 | 8/2002 | Hochstein |
| 6,452,217 B1 | 9/2002 | Wojnarowski et al. |
| 6,498,355 B1 * | 12/2002 | Harrah et al. ............ 257/99 |
| 6,531,230 B1 | 3/2003 | Weber et al. |
| 6,541,800 B2 | 4/2003 | Barnett et al. |
| 6,714,348 B2 | 3/2004 | Dunn |
| 6,784,462 B2 | 8/2004 | Schubert |
| 6,936,855 B1 * | 8/2005 | Harrah ............ 257/88 |
| 6,969,874 B1 | 11/2005 | Gee et al. |
| 7,030,423 B2 | 4/2006 | Chang et al. |
| 2001/0030866 A1 | 10/2001 | Hochstein |
| 2002/0117964 A1 | 8/2002 | Malone et al. |
| 2003/0057421 A1 | 3/2003 | Chen |
| 2003/0160256 A1 | 8/2003 | Durocher et al. |
| 2003/0189830 A1 | 10/2003 | Sugimoto et al. |
| 2004/0012958 A1 | 1/2004 | Hashimoto et al. |
| 2004/0042212 A1 | 3/2004 | Du et al. |
| 2004/0065894 A1 | 4/2004 | Hashimoto et al. |
| 2004/0135162 A1 | 7/2004 | Chin et al. |
| 2004/0218388 A1 | 11/2004 | Suzuki |
| 2004/0228106 A1 | 11/2004 | Stevenson et al. |
| 2004/0228107 A1 | 11/2004 | Lee et al. |
| 2004/0233665 A1 | 11/2004 | West et al. |
| 2005/0001537 A1 | 1/2005 | West et al. |
| 2005/0116235 A1 | 6/2005 | Schultz et al. |
| 2005/0265029 A1 | 12/2005 | Epstein et al. |
| 2006/0098438 A1 | 5/2006 | Ouderkirk et al. |
| 2006/0131596 A1 | 6/2006 | Ouderkirk et al. |
| 2006/0131601 A1 | 6/2006 | Ouderkirk et al. |
| 2006/0138621 A1 | 6/2006 | Bogner et al. |
| 2006/0198147 A1 | 9/2006 | Ge |

FOREIGN PATENT DOCUMENTS

| | | |
|---|---|---|
| EP | 328088 B | 5/1994 |
| EP | 1 467 414 | 10/2004 |
| WO | WO 00/69000 | 11/2000 |
| WO | WO 03/052838 | 6/2003 |

OTHER PUBLICATIONS

Lumileds Lighting U.S., LLC, "Luxeon® Star power light source", [retrieved from internet Dec. 17, 2004], URL <lumileds.com/pdfs/DS23.pdf>, Nov. 2004, 15 pages.

* cited by examiner

ILLUMINATION ASSEMBLY AND METHOD OF MAKING SAME

RELATED PATENT APPLICATIONS

The following co-owned and copending U.S. patent applications are incorporated herein by reference: ILLUMINATION ASSEMBLY AND METHOD OF MAKING SAME Ser. No. 11/018,698; ILLUMINATION ASSEMBLY AND METHOD OF MAKING SAME Ser. No. 11/018,961.

BACKGROUND

The present disclosure generally relates to a lighting or illumination assembly. More particularly, the present disclosure relates to a lighting or illumination assembly that uses an array of light emitting diodes (LEDs).

Illumination assemblies are used in a variety of diverse applications. Traditional illumination assemblies have used lighting sources such as incandescent or fluorescent lights, for example. More recently, other types of light emitting elements, and light emitting diodes (LEDs) in particular, have been used in illumination assemblies. LEDs have the advantages of small size, long life, and low power consumption. These advantages of LEDs make them useful in many diverse applications.

For many lighting applications, it is desirable to have one or more LEDs supply the required light intensity and/or distribution. For example, several LEDs can be assembled in an array having small dimensions to provide a high illuminance in a small area, or the LEDs can be distributed over a larger area to provide a broader and more uniform illuminance.

LEDs in an array are commonly connected to each other and to other electrical systems by mounting the LEDs onto a printed circuit board substrate. LEDs may be populated onto a substrate using techniques that are common to other areas of electronics manufacturing, e.g., locating components onto circuit board traces, followed by bonding the components to the substrate using one of a number of known technologies, including wave soldering, reflow soldering, and attachment using conductive adhesives.

Common LED packages used to hold LED die include one or more LEDS mounted in a ceramic or plastic package, with electrical connections provided through wires or solder bonds such as surface mounted packages or T1 ¾-type "jellybean" packages, etc. However, these techniques and designs sometimes provide poor thermal conductivity from the LED package to a heat sink, and the circuitized substrates used can be expensive and provide poor light reflectivity.

High thermal conductivity can be important for increasing the light output of an LED and extending its operating lifetime. Further, the reflectivity of the substrate can also be important in applications where the LED illuminates an optical cavity and a significant fraction of the light emitted by the LED reflects off the circuit substrate inside in the optical cavity.

SUMMARY

The embodiments described herein are particularly useful for the manufacture and use of LED arrays that are utilized for lighting purposes or for information display.

In one aspect, the present disclosure provides an illumination assembly that includes a thermally conductive substrate, and a patterned conductive layer proximate a major surface of the thermally conductive substrate. The assembly also includes a reflective dielectric layer positioned between the patterned conductive layer and the major surface of the substrate, and at least one LED including a post that is attached to the thermally conductive substrate such that at least a portion of the post is embedded in the thermally conductive substrate. The at least one LED is thermally connected to the thermally conductive substrate through the post and electrically connected to the patterned conductive layer.

In another aspect, the present disclosure provides a method of making an illumination assembly that includes providing a thermally conductive substrate, and forming a dielectric layer on a major surface of the thermally conductive substrate. The method further includes forming a patterned conductive layer on the dielectric layer, providing at least one LED including a post, and attaching the at least one LED to the thermally conductive substrate such that at least a portion of the post is embedded in the thermally conductive substrate. The at least one LED is thermally conductive substrate through the post and electrically connected to the patterned conductive layer.

In another aspect, the present disclosure provides a display that includes an illumination assembly. The assembly includes a thermally conductive substrate, and a patterned conductive layer proximate a major surface of the thermally conductive substrate. The assembly further includes a reflective dielectric layer positioned between the patterned conductive layer and the major surface of the thermally conductive substrate, and at least one LED including a post that is attached to the thermally conductive substrate such that at least a portion of the post is embedded in the thermally conductive substrate. The at least one LED is thermally connected to the thermally conductive substrate through the post and electrically connected to the patterned conductive layer. The display also includes a spatial light modulator optically coupled to the illumination assembly, where the spatial light modulator includes a plurality of controllable elements operable to modulate at least a portion of light from the illumination assembly.

The above summary of the present disclosure is not intended to describe each disclosed embodiment or every implementation of the present disclosure. The Figures and Detailed Description that follow more particularly exemplify illustrative embodiments.

DETAILED DESCRIPTION

The present disclosure is applicable to illumination assemblies, and is more particularly applicable to illumination assemblies that provide illumination using LEDs. The illumination assemblies disclosed herein may be used for general lighting purposes, e.g., to illuminate an area, or for providing information to a viewer by selective illumination of different areas of the assembly as in an information display. Such assemblies are suitable for use in backlight displays, signs, and other lighting applications that require a significant amount of light.

The illumination assemblies of the present disclosure include an LED that is designed to be attachable to a substrate using a number suitable techniques, e.g., press-fitting, piercing, screwing, etc. The substrates are thermally conductive such that heat can be conducted away from the LED. In some embodiments, the substrates are also electrically conductive, thereby providing a circuit pathway for the LED. Further, in some embodiments, the assemblies can include a dielectric layer proximate a major surface of the substrate to reflect at least a portion of light emitted by the LED. Further, some embodiments include an LED having a post that can provide a direct thermal connection to the substrate. In an exemplary embodiment, this direct thermal connection can allow a portion of heat generated by the LED to be directed away from the LED and into the substrate in a direction substantially orthogonal to a major surface of the substrate, thereby reducing the amount of generated heat that is spread laterally away from the LED.

Figure 1:
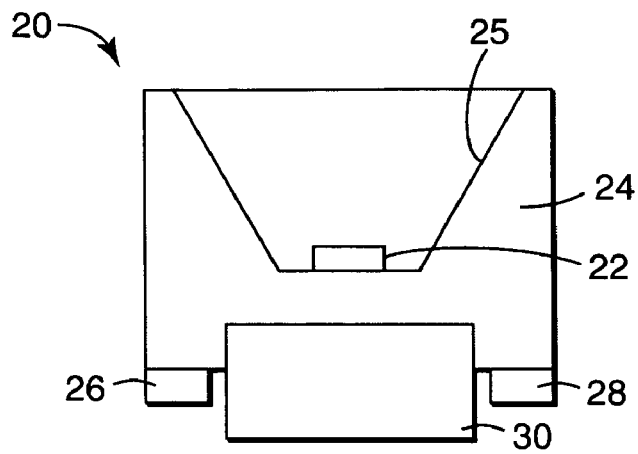
FIG. 1 is a schematic cross-section view of one embodiment of an LED.

FIG. 1 is a schematic cross-section view of one embodiment of an LED 20. The LED 20 includes a die 22 mounted within an LED body 24 that includes a reflective surface 25. The LED 10 also includes a first electrode 26 and a second electrode 28 that are both electrically connected to the die 22, and a post 30.

As used herein, the terms "LED" and "light emitting diode" refer generally to light emitting semiconductor elements with contact areas for providing power to the diode. Different forms of inorganic semiconductor light emitting diodes may be formed, for example, from a combination of one or more Group III elements and of one or more Group V elements (III–V semiconductor). Examples of III–V semiconductor materials that can be used in an LED include nitrides, such as gallium nitride or indium gallium nitride, and phosphides, such as indium gallium phosphide. Other types of III–V materials can also be used, as can inorganic materials from other groups of the periodic table.

The LEDs may be in packaged or non-packaged form, including, for example, LED dies, surface-mounted LEDs, chip-on-board LEDs and LEDs of other configurations. Chip-on-board (COB) refers to LED dies (i.e., unpackaged LEDs) mounted directly onto the circuit substrate. The term LED also includes LEDs packaged or associated with a phosphor where the phosphor converts light emitted from the LED to light at a different wavelength. Electrical connections to the LED can be made by wire bonding, tape automated bonding (TAB), or flip-chip bonding. The LEDs are schematically depicted in the illustrations, and can be unpackaged LED dies or packaged LEDs as described herein.

LEDs can be top emitting, such as those described in U.S. Pat. No. 5,998,935 (Shimizu et al.). Alternatively, LEDs can be side-emitting, such as those described in U.S. Patent Publication No. 2004/0,233,665 A1 (West et al.).

LEDs can be selected to emit at any desired wavelength, such as in the red, green, blue, ultraviolet, or infrared spectral regions. In an array of LEDs, the LEDs can each emit in the same spectral region, or can emit in different spectral regions. Different LEDs may be used to produce different colors where the color of light emitted from the light emitting element is selectable. Individual control of the different LEDs leads to the ability to control the color of the emitted light. In addition, if white light is desired, then a number of LEDs emitting light of different colors may be provided, whose combined effect is to emit light perceived by a viewer to be white. Another approach to producing white light is to use one or more LEDs that emit light at a relatively short wavelength and to convert the emitted light to white light using a phosphor wavelength converter. White light is light that stimulates the photoreceptors in the human eye to yield an appearance that an ordinary observer would consider "white." Such white light may be biased to the red (commonly referred to as warm white light) or to the blue (commonly referred to as cool white light). Such light can have a color rendering index of up to 100.

The LED 20 of FIG. 1 may include any suitable LED die 22. For example, the LED die 22 can include distinct p- and n-doped semiconductor layers, substrate layers, buffer layers, and superstrate layers. The primary emitting surface, bottom surface, and side surfaces of the LED die 22 are shown in a simple rectangular arrangement, but other known configurations are also contemplated, e.g., angled side surfaces forming, for example, a truncated pyramid shape that can either be upright or inverted. Electrical contacts to the LED die are also not shown for simplicity, but can be provided on any of the surfaces of the die as is known.

Although the LED 20 is depicted as having one die 22, the LED 20 can include two or more dies 22, e.g., a red-emitting die, a green-emitting die, and a blue-emitting die. In some embodiments, the LED die 22 may be a flip-chip design such that both electrical contacts are on a bottom surface of the die 22. In such an embodiment, any suitable technique may be used to electrically connect the die 22 to the first and second electrode 26, 30 of the LED 20.

Figure 2:
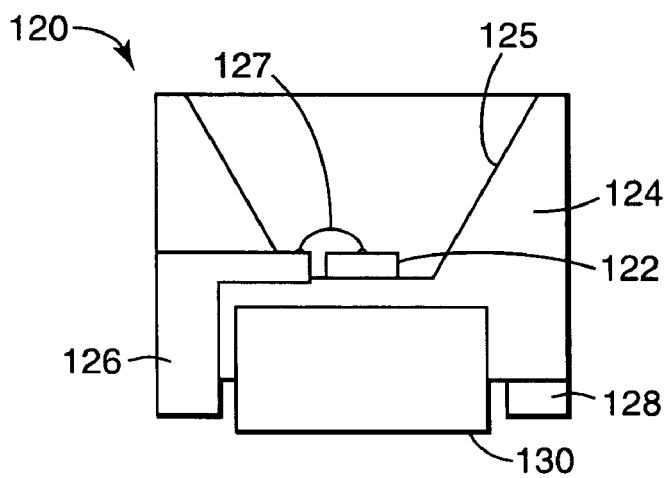
FIG. 2 is a schematic cross-section view of another embodiment of an LED.

In an alternative embodiment, the LED 20 may include a wire bond LED die 22. For example, FIG. 2 is a schematic cross-section view of and LED 120 that includes a one-wire bond LED die 122. The die 122 is electrically connected to a first electrode 126 through a wire 127 that is attached to a top surface of the die 122. A bottom surface of the die 122 is electrically connected to a second electrode 128 of the LED 120. In some embodiments, the LED die 122 can also have two or more wire bonds on any suitable surface or multiple surfaces of the die 122 that electrically connects the die 122 to the first and/or second electrodes 126, 128 and/or post 130. Any suitable wire or wires may be used to connect the die 122 to the first electrode 126. Further, any suitable technique may be used to attach the wire 127 to the die 122 and the first electrode 126. The LED 120 also includes an LED body 124 including a reflector 125, and a post 130. All of the design considerations and possibilities described herein with respect to the LED die 22, body 24, first and second electrodes 26, 28, and the post 30 of the embodiment illustrated in FIG. 1 apply equally to the LED die 122, body 124, first and second electrodes 126, 128, and the post 130 of the embodiment illustrated in FIG. 2.

Returning to FIG. 1, the LED body 24 includes reflective surface 25 that captures edge-emitted light from the LED die 22 and bends it forward. Any suitable material or materials may be used to form the LED body 24, e.g., metal, polymeric, etc. The reflective surface 25 may be specularly or diffusely reflective. In some embodiments, the reflective surface 25 may include a multi-layer polymer reflective film such as Vikuiti™ ESR film available from 3M Company, St. Paul, Minn.

The LED 20 also includes a post 30 that is thermally connected to the LED die 22. The post 30 can act as a low thermal resistance pathway for heat to be directed from the die 22 and out of the LED 20. The post 30 may be in contact with the die 22. Alternatively, the post 30 may be thermally connected to the die 22 through a thermally conductive adhesive or other material.

Any suitable material or materials may be used to form the post 30. In some embodiments, the post 30 includes a thermally conductive material, e.g., copper, nickel, gold, aluminum, tin, lead, silver, indium, zinc oxide, beryllium oxide, aluminum oxide, sapphire, diamond, aluminum nitride, silicon carbide, graphite, magnesium, tungsten, molybdenum, silicon, polymeric binders, inorganic binders, glass binders, and combinations thereof. The post 30 may also contain a working fluid for higher heat transfer rates. The post 30 may thus be considered a heat pipe, where the fluid transport is by capillary flow or two-phase liquid/boiling system. Further, in some embodiments, the post 30 may be electrically conductive. Any suitable electrically conductive material or materials may be used to form electrically conductive post 30, e.g., copper, nickel, gold, aluminum, tin, lead, silver, indium, and combinations thereof. In an exemplary embodiment, the post 30 may be both thermally and electrically conductive.

Further, the electrically conductive post 30 can be segmented to provide electrical isolation of parts of the post 30. It may be preferred that such segmentation is done in the longitudinal manner such that each segment has good thermal conductivity. For example, a cylindrical post could be composed of two half-cylinders of thermally and electrically conductive material, e.g., aluminum, laminated together with a dielectric layer or region interposed between them to form a highly thermally conductive post along the length but with relatively limited thermal conductivity across the post diameter and with no electrical conductivity across the post diameter. More than two segments of the post are possible as well.

The post 30 can take any suitable size or shape. In some embodiments, the post 30 can take a cylindrical shape. Alternatively, the post 30 can take a tapered shape. Further, in some embodiments, the post 30 may include one or more threads as is further described herein. Although the post 30 is depicted as including a single post or unitary body, the post 30 can include two or more posts, each in contact with the thermally conductive substrate 12. In some embodiments, the post 30 may include one or more protuberances that may aid in attaching the LED 20 to a substrate as is also further described herein.

The LED body 24 may be permanently attached to the post 30 using any suitable technique, e.g., adhering, bonding, welding, etc. In some embodiments, the post 30 may be integral with the LED body 24. Alternatively, the LED body 24 may be removably attached to the post 30. Any suitable technique may be used to removably attach the LED body 24 to the post 30. For example, the post 30 may include one or more threads, and the LED body 24 may also include one or more threads such that the body 24 may be threaded onto the post 30. Alternatively, the LED body 24 may be friction-fit onto the post 30.

In general, LEDs can be connected to power sources and substrates using conventional circuit boards and films. While LEDs share many of the same requirements as most other electronic components, there are differences. First, LEDs can be expensive, and the most cost-effective designs for building lighting systems using LEDs can have high junction to heat sink thermal resistance. Second, LEDs often illuminate an optical cavity, where the light may experience several reflections off the circuit board substrate.

To help prevent light absorption in the assembly, circuit substrates may be manufactured by coating a circuit board with a highly reflective coating, e.g., a titania filled coating or a reflective film. However, both of these types of coatings need to be patterned for the LED to make electrical and thermal contact with the circuit board through the coating. This patterning of the reflective coating or film can be expensive and may not provide good thermal conductivity from the LED to the circuit board substrate.

An alternative circuit board substrate is one where the mounting of the LED to the circuit also enables good thermal contact with the circuit board and patterns the reflector.

In general, the LEDs of the present disclosure can be attached to a substrate using a number of suitable techniques, e.g., press-fitting, piercing, screwing, etc. Such LEDs are designed to be quickly and easily attached to various substrates.

Figure 3:
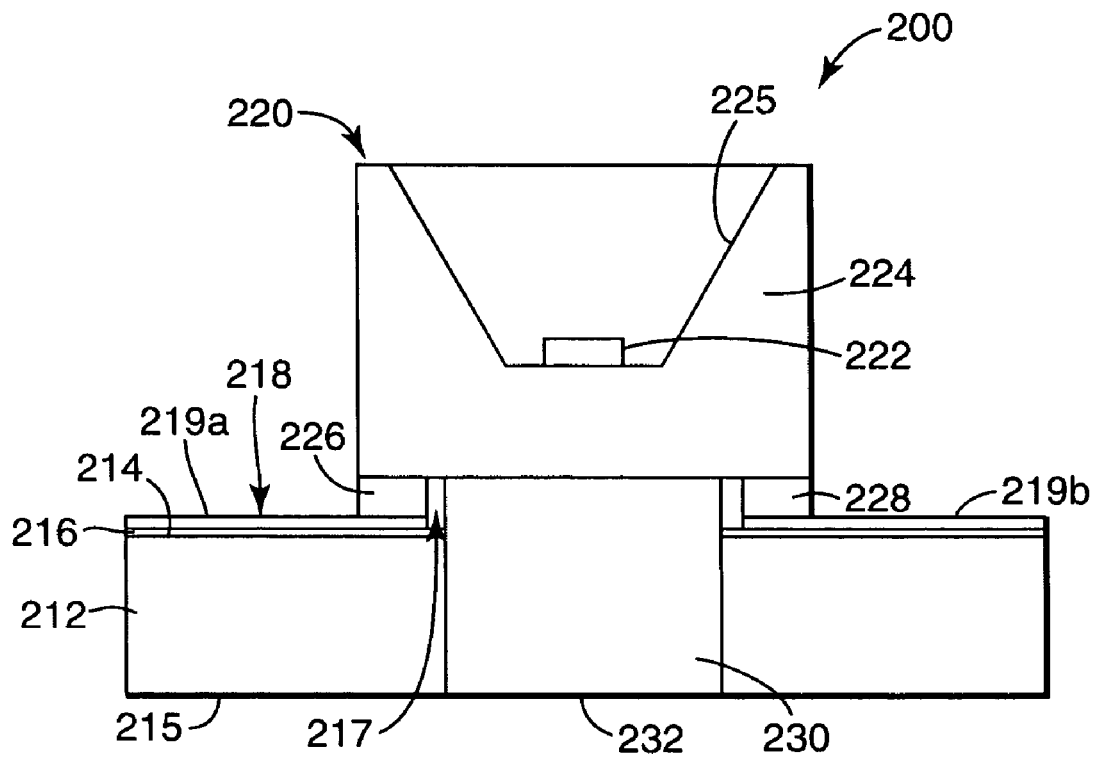
FIG. 3 is a schematic cross-section view of one embodiment of an illumination assembly.

For example, FIG. 3 is a schematic cross-section view of one embodiment of an illumination assembly 200. The assembly 200 includes a thermally conductive substrate 212, a patterned conductive layer 218 proximate a first major surface 214 of the thermally conductive substrate 212, a dielectric layer 216 positioned between the patterned conductive layer 218 and the first major surface 214, and at least one LED 220.

The thermally conductive substrate 212 includes the first major surface 214 and a second major surface 215. The substrate 212 may include any suitable material or materials that are thermally conductive, e.g., copper, nickel, gold, aluminum, tin, lead, silver, indium, gallium, zinc oxide, beryllium oxide, aluminum oxide, sapphire, diamond, aluminum nitride, silicon carbide, pyrolite, graphite, magnesium, tungsten, molybdenum, silicon, polymeric binders, inorganic binders, glass binders, polymers loaded with thermally conductive particles that may or may not be electrically conductive, capillary flow heat pipes, two-phase heat transport devices, and combinations thereof. In some embodiments, the substrate 212 can be weldable (e.g., ultrasonically weldable) to another material or materials, e.g., weldable to aluminum, copper, metal coated ceramic or polymer, or thermally conductive filled polymer. The substrate 212 can include any suitable size and shape.

In some embodiments, the thermally conductive substrate 212 may also be electrically conductive. Such an electrically conductive substrate may include any suitable electrically conductive material or materials, e.g., copper, nickel, gold, aluminum, tin, lead, silver, indium, gallium, and combinations thereof.

The thermally conductive substrate 212 may serve a combination of purposes, including making an electrical connection to the LED 220, providing a direct thermal pathway away from the LED 220, providing heat spreading laterally away from the LED 220, and providing electrical connections to other systems, for example.

In some embodiments, the thermally conductive substrate 212 can be flexible. In such embodiments, it may be preferred that the dielectric layer 216 and the patterned conductive layer 218 are also flexible. A suitable flexible material having a polyimide insulative substrate with copper conductive layers thereon is 3M ™Flexible Circuitry, available from 3M Company.

Proximate the first major surface 214 of the thermally conductive substrate 212 is the patterned conductive layer 218. In the embodiment illustrated in FIG. 3, the patterned conductive layer 218 includes a first conductor 219*a* and a second conductor 219*b*. Any suitable number of conductors may be formed in or from the patterned conductive layer 218. The patterned conductive layer 218 may include any suitable electrically conductive material or materials. Such suitable materials include gold, copper, aluminum, and silver in either a pure form or in an alloy. The conductors of the patterned conductive layer 218 may also be bare or insulated wires or strips. If the wire or strip is insulated, it may be preferred that the insulator be transparent and the wire or strip be highly reflective, or that the insulation be highly reflective, e.g., a titania filled polymer. In some embodiments, the patterned conductive layer 218 may be reflective.

The wires or strips may be laid in a single dimension array, or may be placed in an orthogonal array, or a three-wire control system. The orthogonal array or 3-wire control system may be used to provide logic signals to individual LEDs. For example, an LED may be electrically connect to an integrated circuit that acquires a signal and power from a two or three lead circuit, where the LED has a predetermined optical output in response to the control signal.

The patterned conductive layer 218 may be patterned using any suitable technique known in the art, e.g., chemical etching, photolithography, chemical vapor deposition, ink-jet printing, etc. In embodiments where the assembly 200 includes an array of LEDs, the patterned conductive layer 218 may be patterned such that each LED of the array is individually addressable.

Positioned between the patterned conductive layer 218 and the first major surface 214 of the substrate 212 is the dielectric layer 216. In the illustrated embodiment, the dielectric layer 216 includes at least one aperture 217 that extends through the dielectric layer 216 such that the LED 220 can be thermally, and in some embodiments electrically, connected to the thermally conductive substrate 212 as is further described herein. In some embodiments, the dielectric layer 216 may be reflective. In such embodiments, it may be preferred that the dielectric layer 216 reflects at least 80% of light incident thereon. It may be more preferred that the dielectric layer 216 reflects at least 95% of light incident thereon. It may be even more preferred that the dielectric layer 216 reflects at least 99% of light incident thereon. The dielectric layer 216 may be specularly or diffusely reflective.

The dielectric layer 216 can include any suitable dielectric material or materials that provide an insulative, and in some embodiments reflective, layer between the patterned conductive layer 218 and the thermally conductive substrate 212. For example, the dielectric layer 216 may include a combination of metal and dielectric materials such that the combination is non-conductive, e.g., a combination of silver or aluminum and a polymer or inorganic oxide. Other such suitable combinations of metal and dielectric materials include one or more conductive particles, fibers, or other bodies made from silver, copper, aluminum, tin, indium, and gold coated in a layer or a continuous matrix of a dielectric material made from glass, inorganic oxides, condensation polymers such as polyethylene terephthalate, polyethylene naphthalate, saturated polymers such as polyolefins and polyfluoropolymers, and other polymers including epoxies, polystyrene, polycarbonate, polysilozanes, polyvinylstyrenes, polyacrylates, etc.

In other embodiments, the dielectric layer 216 includes a film having multiple polymer layers of alternating refractive index, e.g., those films described in U.S. Pat. No. 5,882,774 (Jonza et al.); U.S. Pat. No. 6,080,467 (Weber et al.); and U.S. Pat. No. 6,531,230 B1 (Weber et al.).

In some embodiments, at least a portion of light emitted by the at least one LED 220 can reflect off of the dielectric layer 216 and be directed away from the substrate 212. In such an embodiment, it may be preferred that the patterned conductive layer 218 also be reflective.

For diffuse reflection, the dielectric layer 216 may be a white diffuse reflector such as a matrix containing diffusely reflecting particles, for example, titanium dioxide particles. In some embodiments, the diffusely dielectric layer 216 can include a filled polymer. In general, filled polymers and paints contain an organic resin or binder and are typically opacified by loading with a suitable inorganic particle such as titania or barium sulfate. Further, the diffusely dielectric layer 216 may include paints, enamels, inorganic powders, highly scattering white powders such as titania, or polytetrafluorethylene (PTFE). For example, enamels may be deposited as a slurry or powder coated (for example, electrophoretically) onto the thermally conductive substrate 212. Such enamel compositions are available that are compatible with thermally conductive materials such as copper or aluminum. Further, for example, PTFE may be deposited as a white powder or formed as a sheet and laminated to the metal substrate. The diffusely dielectric layer 216 may also include a specularly reflective substrate with a diffusely reflective coating or film formed or attached thereon.

The dielectric layer 216 may be attached to the first major surface 214 of the thermally conductive substrate 212, for example, using a pressure sensitive adhesive. Alternatively, the dielectric layer 216 may be formed on the first major surface 214 using any suitable technique, e.g., chemical vapor deposition, plasma vapor deposition, sputtering, and vapor coating. For dielectric layers that include aluminum, the aluminum may be deposited using physical vapor coating techniques, foil lamination, or plating onto the thermally conductive substrate 212. The aluminum may be coated with a protective material, or a reflectivity enhancing layer, or both, such as magnesium fluoride, or by anodizing followed by thermal and/or chemical treatment to seal any conductive pores in the aluminum oxide layer.

As mentioned herein, the dielectric layer 216 includes at least one aperture 217 that is formed through the layer 216. In some embodiments, the aperture 217 is substantially registered with the LED 220 such that the LED 220 can be thermally and/or electrically connected to the thermally conductive substrate 212. The aperture 217 can be formed using any suitable technique depending upon the type of material or materials included in the dielectric layer 216. For example, photolithography can be used to form aperture 217 in dielectric layers that include a photosensitive binder. An inorganic powder can be suspended in a photoresist solution (e.g., a solution containing polyvinyl alcohol and ammonium dichromate or gelatin dichromate). The suspension is coated onto the thermally conductive substrate 212, dried, and exposed through a mask. Unexposed areas are removed by rinsing with water, leaving behind the patterned coating. Powder coatings can be patterned photolithographically by coating the thermally conductive substate 212 with a photoactackifiable coating, exposing the coating through a mask, and then coating or dusting with the powder. Spray coating of powders or powders in a binder is also feasible. The powder coating can be patterned by using a mask that is aligned to the features to be coated.

For a dielectric layer 216 that includes a film or laminated coating such as Vikuiti™ ESR film available from 3M Company, apertures may be formed by punching, die cutting, laser drilling, or flame perforation prior to attachment to the thermally conductive substrate 212. Apertures may also be formed in such films by etching through a patterned resist layer after the film has been attached to the thermally conductive substrate 212. In some embodiments, the aperture 217 can be formed by the LED 220 during the attachment process as is further described herein.

In some embodiments, it may be desirable that the dielectric layer 216 exhibits low reflectivity, or low reflectivity at specific wavelengths or regions of wavelengths. For example, low reflectivity dielectric layers may provide greater contrast for assemblies that include an array of individually addressable LEDs used, e.g., for active signage applications. For such active signs used in high ambient light conditions, low reflectivity at specific wavelengths may be tuned to the specific emission wavelength of the LED light sources so that the dielectric layer is highly reflective at those wavelengths but absorptive over the broader spectrum, thereby providing an increase in light output while still reducing the amount of ambient light reflected by the layer.

Suitable materials for such low reflectivity dielectric layers include carbon filled polymers, especially low index polymers including polyolefins and fluorocarbons and polymers filled with dyes or pigments or both. The polymer surfaces may be antireflective to reduce reflectivity. Suitable antireflection methods include interference coatings known in the art to reduce reflectivity, including suitably designed layers of high and low index materials, single layers of low index materials, boehmite made by hydrolyzing a thin coating of aluminum, sol-gel coatings, moth's-eye microstructured coatings, and graded index coatings. Also suitable are sintered coatings of absorbing materials.

The illumination assembly 200 of FIG. 3 also includes at least one LED 220. Any suitable number of LEDs can be included in the assembly 200. In some embodiments, the assembly 200 can include an array of LEDs 220. Such an array may be arranged on the substrate 212 in a rectangular pattern or a square pattern. This leads to easy display of vertical and horizontal lines in an information display application. A rectangular or square pattern is not required, however, and the LEDs 220 may be laid out on the thermally conductive substrate 212 in some other pattern, e.g., a hexagonal pattern. Alternatively, the LEDs 220 can be randomly arrayed on the thermally conductive substrate 212.

The at least one LED 220 includes at least one LED die 222 electrically connected to a first electrode 226 and a second electrode 228. The LED 220 further includes an LED body 224 including a reflective surface 225. The LED die 222 is thermally connected to a post 230. All of the design considerations and possibilities described herein with respect to the LED die 22, body 24, first and second electrodes 26, 28, and the post 30 of the embodiment illustrated in FIG. 1 apply equally to the LED die 222, body 224, first and second electrodes 226, 228, and the post 230 of the embodiment illustrated in FIG. 3.

The at least one LED 220 is thermally connected to the thermally conductive substrate 212 through the post 230, which is positioned in the aperture 217 of the dielectric layer 216. The post 230 may be in direct contact with the thermally conductive substrate 212. Alternatively, the post 230 may be thermally connected to the substrate 212 through a thermally conductive bonding material, e.g., curable polymer precursors such as acrylates, styrene, vinyl styrene, silanes, and epoxies that are filled with zinc oxide, sapphire, diamond, silicon carbide, or aluminum nitride.

At least a portion of the post 230 is embedded in the thermally conductive substrate 212. In some embodiments, the post 230 is embedded such that a first end 232 of the post 230 is located within the thermally conductive substrate 212. In other embodiments, the post 230 is embedded such that the first end 232 is outside of the second major surface 215 of the thermally conductive substrate 212. By embedding at least a portion of the post 230 into the thermally conductive substrate 212, the surface area of the post 230 that is in contact with the thermally conductive substrate 212 is greater than if the post 230 were only in contact with the first major surface 214 of the substrate 212. This increased contact can improve thermal conductivity.

The at least one LED 220 is electrically connected to the patterned conductive layer 218 through its first electrode 226 and second electrode 228. Specifically, the first electrode 226 is electrically connected to the first conductor 219a, and the second electrode 228 is electrically connected to the second conductor 219b. Any suitable technique may be used to electrically connect the LED 220 with the patterned conductive layer 218. For example, the first and second electrodes 226, 228 may be ultrasonically bonded to the first and second conductors 219a–b. Alternatively, the LED 220 may be attached to the thermally conductive substrate 212 such that the first and second electrodes 226, 228 remain in non-bonded electrical contact with the first and second conductors 219a–b. Alternatively, the first and second electrodes 226, 228 may be soldered to the first and second conductors 219a–b.

The first and second electrode 226, 228 can also be formed by applying an ink that hardens to form a conductor. Suitable inks include dispersions of a conductive particle such as silver in a solvent. The conductive particles may be treated with radiation, heat, or chemical agents to increase conductivity after the ink has at least partially hardened. Suitable techniques for applying the ink include ink-jet printing, silk screening, and contact printing. In other embodiments, solder paste may be deposited on the first or second conductors 219a–b by printing, screening, or dispensing. The first and second electrodes 226, 228 may be attached to the first and second conductors 219a–b by reflow soldering or thermal curing (which can occur during reflow, or by a separate curing cycle.). Alternatively, the at least one LED 220 may be electrically connected to the patterned conductive layer 218 using, e.g., a pressure sensitive adhesive or z-axis conductive adhesive.

The at least one LED 220 may be thermally connected to the thermally conductive substrate 212 through the post 230. Any suitable technique may be used to attach the LED 220 to the thermally conductive substrate 212. For example, an indentation or opening can be formed in the thermally conductive substrate 212, and the post 230 of the LED 220 press-fit into the indentation. The LED 220 remains attached to the thermally conductive substrate 212 by friction between the post 230 and the substrate 212. Any suitable technique may be used to form an indentation or opening in the substrate 212, e.g., knurling, embossing, etching, ablating, punching, etc.

Alternatively, the at least one LED 220 can be attached to the substrate 212 by piercing the substrate 212 with the post 230 without first forming an indentation or hole in the substrate 212. To facilitate piercing of the substrate 212, the post 230 can include a pointed or sharpened first end 232.

In typical backlit displays where illumination assemblies are positioned within or proximate an optical cavity, light emitted by LEDs or other light sources may experience several reflections off of the circuit board substrate. Such circuit board substrates may be manufactured with a highly reflective coating on the circuit board, including, for example, a titania filled coating or a reflective film. Either of these types of reflectors need to be patterned for the LED to make electrical and thermal contact with the circuit board. This patterning is typically expensive, and, because of the nature of the circuit board, may still have poor thermal conductivity from the LED junction to the board. In the assemblies of the present disclosure, the dielectric layer need not be pre-patterned with an aperture. Instead, the process of attaching the at least one LED 220 to the substrate 212 can cause a portion of the dielectric layer 216 to be removed such that at least a portion of the post 230 is attached to the substrate 212. This can significantly reduce the cost incurred by patterning another type of reflective layer. For example, in the embodiment illustrated in FIG. 3, a portion of the dielectric layer 216 may be removed when the post 230 is press-fit into the thermally conductive substrate 212.

In some embodiments, the at least one LED 220 may be both thermally and electrically connected to the thermally conductive substrate 212 through the post 230. In other words, one or both of the electrodes for the LED die 222 may be electrically connected to the post 230. In such an embodiment, the thermally conductive substrate 212 becomes a common connection for the one or more LEDs 220 that are attached to the substrate 212. Thus, in addition to thermally conducting heat away from the LED 220, the thermally conductive substrate 212 is also an active element of the electrical circuits of the illumination assembly 200. For example, the thermally conductive substrate 212 may provide a common electrical ground to each of the LEDs 220 in the assembly 200. Further, when the thermally conductive substrate 212 is composed of a material or materials having good electrical conductivity, additional benefits including an even current distribution with low voltage drop and EMI shielding may be achieved. Any suitable technique can be used to electrically connect one or both electrodes of the LED die 222 to the post 230.

As mentioned herein, any suitable technique may be utilized to attach the LEDs of the present disclosure to the thermally conductive substrate. In some embodiments, the post of the LED can be attached or bonded to the substrate without the LED body first being attached to the post.

In general, the at least one LED 220 may be attached to the thermally conductive substrate 212 by first attaching the post 230 to the substrate 212 using any suitable technique, e.g., press-fitting, piercing, screwing, etc. If the dielectric layer 216 includes aperture 217, then the post 230 is brought into thermal connection with the substrate 212 through the aperture 217. In other embodiments, the aperture 217 may be formed through the dielectric layer 216 during the attachment process as is further described herein. After the post 230 is attached to the substrate 212, the LED body 224 may be attached to the post 230 using any suitable technique. In one embodiment, the LED body 224 and the post 230 include threads such that the body 224 can be threaded onto the post 230 until the first electrode 226 and the second electrode 228 are electrically connected to the patterned conductive layer 218 either by physical force due to the tightening of the LED body 224 onto the post 230, or by other suitable types of electrical connecting, e.g., soldering, adhering, etc. Alternatively, the LED body 224 can be friction-fit onto the post 230, or the LED body 224 can include retention protuberances or other devices known in the art for attachment to the post.

Figure 4:
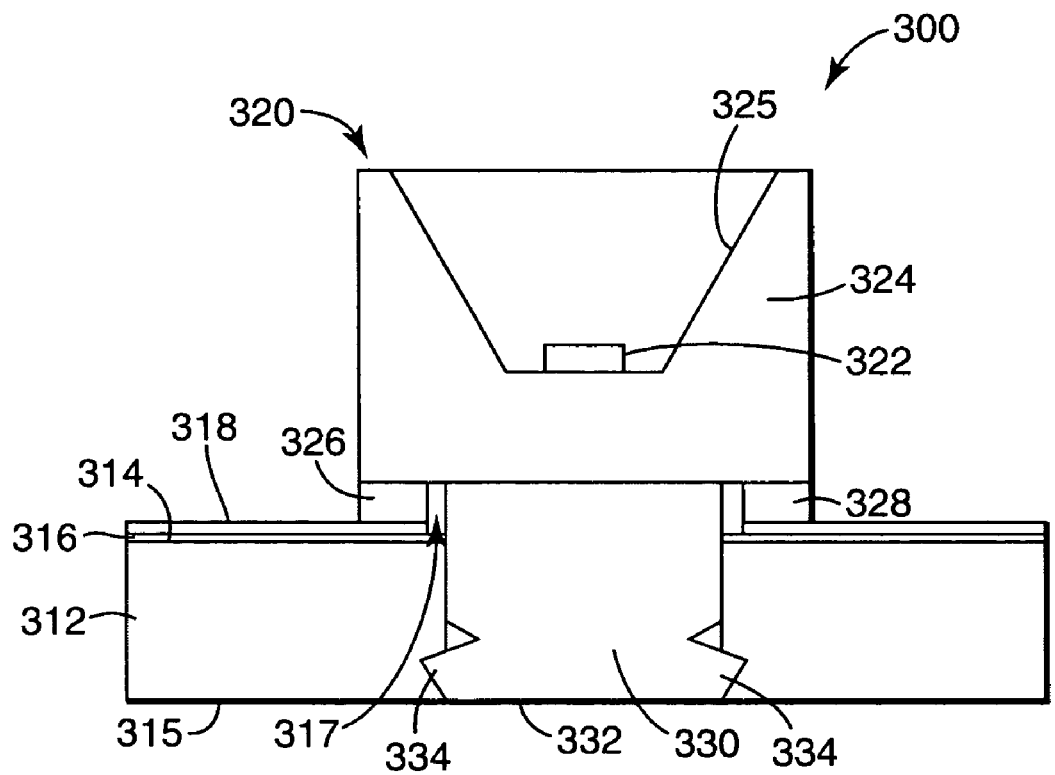
FIG. 4 is a schematic cross-section view of another embodiment of an illumination assembly.

Any suitable device or technique can be used to prevent the LED 220 from becoming detached from the thermally conductive substrate 212. For example, the post 230 can include one or more protuberances to help fixedly attach the LED 220 to the substrate 212. For example, FIG. 4 is a schematic cross-section view of an illumination assembly 300 that includes a thermally conductive substrate 312, a patterned conductive layer 318 proximate a first major surface 314 of the substrate 312, a dielectric layer 316 positioned between the patterned conductive layer 318 and the first major surface 314, and at least one LED 320 attached to the substrate 312. All of the design considerations and possibilities described herein with respect to the substrate 212, the patterned conductive layer 218, the dielectric layer 216, and the LED 220 of the embodiment illustrated in FIG. 3 apply equally to the substrate 312, the patterned conductive layer 318, the dielectric layer 316, and the LED 320 of the embodiment illustrated in FIG. 4.

In the embodiment illustrated in FIG. 4, the at least one LED 320 includes at least one LED die 322 electrically connected to a first electrode 326 and a second electrode 328. The LED 320 also includes an LED body 324 including a reflective surface 325. The at least one LED 320 includes a post 330 that has protuberances 334 extending from an outer surface of the post 320 proximate a first end 332. The protuberances 334 are shaped as barbs that penetrate into the thermally conductive substrate 312 and help prevent the LED 320 from becoming detached from the substrate 312.

Figure 5:
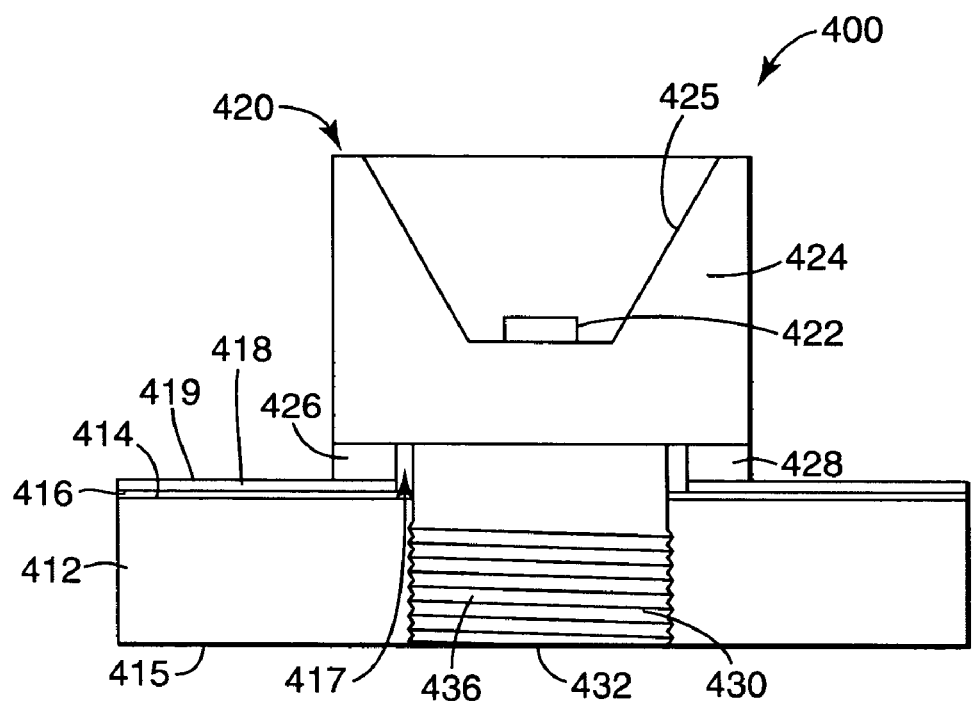
FIG. 5 is a schematic cross-section view of another embodiment of an illumination assembly.

As mentioned herein, any suitable technique may be utilized to attach LEDs to the thermally conductive substrate. For example, FIG. 5 is a schematic cross-section view of another embodiment of an illumination assembly 400. As illustrated, the assembly 400 includes a thermally conductive substrate 412, a patterned conductive layer 418 proximate a first major surface 414 of the substrate 412, a dielectric layer 416 positioned between the patterned conductive layer 418 and the first major surface 414, and at least one LED 420. All of the design considerations and possibilities described herein with respect to the substrate 212, the patterned conductive layer 218, the dielectric layer 216, and the LED 220 of the embodiment illustrated in FIG. 3 apply equally to the substrate 412, the patterned conductive layer 418, the dielectric layer 416, and the LED 420 of the embodiment illustrated in FIG. 5.

In the embodiment illustrated in FIG. 5, the at least one LED 420 includes at least one LED die 422 electrically connected to a first electrode 426 and a second electrode 428. The LED 420 also includes an LED body 424 including a reflective surface 425. Further, the at least one LED 420 includes a post 430 that includes one or more threads 436 for threading or screwing the LED 420 into the thermally conductive substrate 412. To facilitate attachment to the post 430, the LED body 424 may also include threads to mate with the threads of post 430 such that the LED body 424 is removably attached to the post 430 as is further described herein.

In general, to attach the at least one LED 420 to the thermally conductive substrate 412, the post 430 is either threaded into a threaded indentation or opening in the substrate 412. Alternatively, the post 430 may include a sharpened first end 432 that can be screwed into the substrate 412 without first forming an indentation or opening in the substrate 412. In such an embodiment, a pilot or starter indention can be formed in the substrate 412 to aid in screwing the post 430 into the substrate 412. As previously mentioned, the post 430 may first be attached to the substrate 412, and then the LED body 424 can be attached to the post 430. In such an embodiment, the LED body 424 is screwed onto the post 430 until the first electrode 426 and second electrode 428 become electrically connected to the patterned conductive layer 418. Alternatively, the LED body 424 may be attached to the post 430 prior to the post 430 being attached to the substrate 412.

The dielectric layer 416 can include at least one aperture 417. The post 430 is positioned in the at least one aperture 417 and screwed into the thermally conductive substrate 412. As described herein, the aperture 417 can either be formed using any suitable technique prior to LED attachment, or the post 430 can be used to pierce or puncture the dielectric layer 416 while the LED 420 is being attached to the thermally conductive substrate 412.

Figure 6:
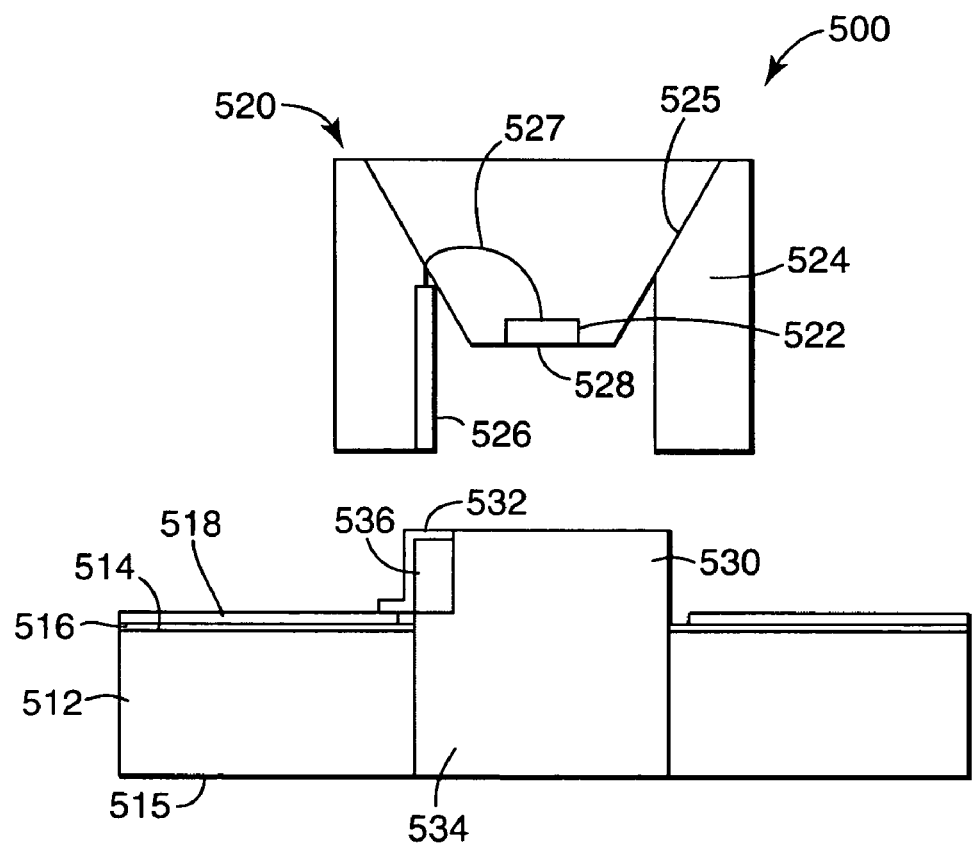
FIG. 6 is a schematic view of another embodiment of an illumination assembly.

As previously mentioned herein, the posts of the present disclosure can provide not only thermal connection between the LED and the thermally conductive substrate, but also electrical connection. In such embodiments, at least one of the electrodes of the LED die is electrically connected to the post. In some embodiments, the post may provide electrical connection between both the LED and the patterned conductive layer and the thermally conductive substrate. For example, FIG. 6 is a schematic cross-section view of another embodiment of an illumination assembly 500. The system 500 includes a thermally conductive substrate 512, a patterned conductive layer 518 proximate a first major surface 514 of the substrate 512, a dielectric layer 516 positioned between the patterned conductive layer 518 and the first major surface 514, and at least one LED 520. All of the design considerations and possibilities described herein with respect to the substrate 212, the patterned conductive layer 218, the dielectric layer 216, and the LED 220 of the embodiment illustrated in FIG. 3 apply equally to the substrate 512, the patterned conductive layer 518, the dielectric layer 516, and the LED 520 of the embodiment illustrated in FIG. 6. The schematic view of FIG. 6 shows LED body 524 separated from post 530 for illustrative purposes only.

The at least one LED 520 includes at least one LED die 522 electrically connected to a first electrode 526 through wire 527, and a second electrode 528. The LED 520 also includes an LED body 524 including a reflective surface 525.

In the illustrated embodiment, the LED 520 includes a post 530 having a first conductive region 532 and a second conductive region 534 separated by a dielectric region 536. The first conductive region 532 mechanically and electrically connects the first electrode 526 of the LED 520 to the patterned conductive layer 518. The second conductive region 534 electrically connects the second electrode 528 of the LED 520 to the thermally conductive substrate 512. The second region 534 also thermally connects the LED 520 to the thermally conductive substrate 512. The first and second conductive regions 532, 534 of the post 530 can include any suitable size and shape. Further, any suitable dielectric material or materials may be used for dielectric region 536 so that the first conductive region 532 is electrically isolated from the second conductive region 534.

The LED 520 may be friction-fit onto the post 530 before or after the post 530 is attached to the substrate 512 such that the first electrode 526 of the LED is electrically connected to the first conductive region 532 of the post 530 and the second electrode 528 of the LED 520 is electrically connected to the second conductive region 534 of the post 530.

Figure 7:
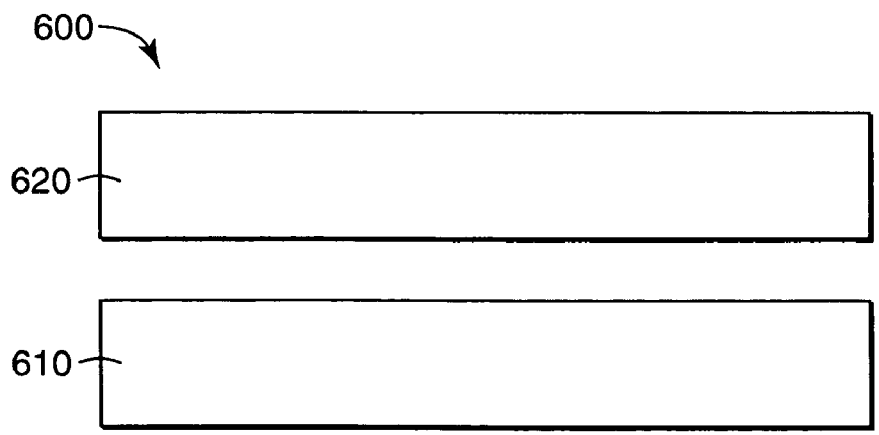
FIG. 7 schematically illustrates one embodiment of a display.

The illumination assemblies of the present disclosure may be used in any suitable manner for providing illumination. For example, some or all of the illumination assemblies described herein may be used to provide illumination for displays. FIG. 7 schematically illustrates a display assembly 600 that includes an illumination assembly 610 optically coupled to a display device 620. The illumination assembly 610 may include any illumination assembly described herein, e.g., illumination assembly 200 of FIG. 3. The illumination assembly 610 provides illumination light to the display device 620. The display device 620 may be any suitable display device, e.g., electrochromatic or electrophoretic devices, spatial light modulator(s), transmissive signs, etc.

For example, the display device 620 may include one or more spatial light modulators. In some embodiments, the one or more spatial light modulators may include an array of individually addressable controllable elements. Such spatial light modulators may include a suitable type of controllable element. For example, the spatial light modulator may include a variable-transmissivity type of display. In some embodiments, the spatial light modulator may include a liquid crystal display (LCD), which is an example of a transmission-type light modulator. In some embodiments, the spatial light modulator may include a deformable mirror device (DMD), which is an example of a reflection-type light modulator.

The display device 620 may include any suitable optical and non-optical elements for producing a display image, e.g., lenses, diffusers, polarizers, filters, beam splitters, brightness enhancement films, etc. The illumination assembly 610 may be optically coupled to the display device 620 using any suitable technique known in the art.

In some embodiments, the display device 620 may be directly lit by the illumination assembly 610. In other words, the display device 620 can be positioned between the illumination assembly 610 and a viewing position, e.g., those direct-lit displays described in U.S. Patent Publication No. 2004/0228106 (Stevenson et al.). In other embodiments, the display device 620 may be side-lit by the illumination assembly 610, i.e., light from the illumination assembly 610 is directed through one or more sides of the display device 620 that are substantially orthogonal to the output surface of the device 620. Such side-lit embodiments may include those systems described in U.S. Patent Publication No. 2004/0228106 (Stevenson et al.).

All references and publications cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An illumination assembly, comprising;
    a thermally conductive substrate;
    a patterned conductive layer proximate a major surface of the thermally conductive substrate;
    a reflective dielectric layer positioned between the patterned conductive layer and the major surface of the substrate; and
    at least one LED comprising a post that is attached to the thermally conductive substrate such that at least a portion of the post is embedded in the thermally conductive substrate, wherein the at least one LED is thermally connected to the thermally conductive substrate through the post and electrically connected to the patterned conductive layer.

2. The assembly of claim 1, wherein the reflective dielectric layer comprises multiple polymer layers of alternating refractive index.

3. The assembly of claim 1, wherein the thermally conductive substrate is also electrically conductive, and further wherein the at least one LED is electrically connected to the thermally and electrically conductive substrate through the post.

4. The assembly of claim 1, wherein the post comprises a threaded post, wherein the at least one LED comprises an LED body, wherein the LED body is threaded onto the threaded post.

5. The assembly of claim 1, wherein the at least one LED comprises an LED body, wherein the LED body is friction-fit onto the post.

6. The assembly of claim 1, wherein the assembly comprises an array of LEDs.

7. The assembly of claim 1, wherein the at least one LED comprises a first electrode electrically connected to a first conductor of the patterned conductive layer and a second electrode electrically connected to a second conductor of the patterned conductive layer.

8. The assembly of claim 1, wherein the post comprises at least one protuberance that attaches the at least one LED to the thermally conductive substrate.

9. The assembly of claim 1, wherein the post comprises a threaded post, and further wherein the post is screwed into the substrate.

* * * * *

UNITED STATES PATENT AND TRADEMARK OFFICE
CERTIFICATE OF CORRECTION

PATENT NO. : 7,285,802 B2 Page 1 of 1
APPLICATION NO. : 11/018605
DATED : October 23, 2007
INVENTOR(S) : Andrew J. Ouderkirk It is certified that error appears in the above-identified patent and that said Letters Patent is hereby corrected as shown below:

Column 1
Line 9, Delete "11/018,698" and insert -- 11/018,608 --, therefor.
Line 9, After 11/018,698 ~~and~~ insert -- (Attorney Docket No. 60116US002) --.
Line 10, After "11/018,961" insert -- (Attorney Docket No. 60390US002) --.

Column 7
Line 59, Delete "polysilozanes," and insert -- polysiloxanes, --, therefor.

Column 8
Lines 13-14, Delete "polytetrafluorethylene" and insert -- polytetrafluoroethylene --, therefor.
Line 55, Delete "substate" and insert -- substrate --, therefor.

Column 14
Line 49, In Claim 1, after "comprising" delete ";" and insert -- : --, therefor.
Line 52, In Claim 1, after "substrate" delete ":" and insert -- ; --, therefor.

Signed and Sealed this

Sixteenth Day of September, 2008

JON W. DUDAS
*Director of the United States Patent and Trademark Office*